United States Patent [19]
Lin

[11] Patent Number: 5,272,024
[45] Date of Patent: Dec. 21, 1993

[54] MASK-STRUCTURE AND PROCESS TO REPAIR MISSING OR UNWANTED PHASE-SHIFTING ELEMENTS

[75] Inventor: Burn J. Lin, Austin, Tex.

[73] Assignee: International Business Machines Corporation, Armonk, N.Y.

[21] Appl. No.: 866,651

[22] Filed: Apr. 8, 1992

[51] Int. Cl.⁵ ............................................. G03F 9/00
[52] U.S. Cl. ...................... 430/5; 430/311; 430/323
[58] Field of Search ............... 430/5, 22, 269, 311, 430/396, 323

[56] References Cited

U.S. PATENT DOCUMENTS

| | | | |
|---|---|---|---|
| 4,360,586 | 11/1982 | Flanders, et al. | 430/321 |
| 4,608,326 | 8/1986 | Newkermans et al. | 430/5 |
| 4,789,611 | 12/1988 | Miyahara | 430/5 |
| 4,890,309 | 12/1989 | Smith et al. | 378/35 |
| 4,906,326 | 3/1990 | Amemiya et al. | 156/626 |
| 5,045,417 | 9/1991 | Kamoto | 430/5 |
| 5,085,957 | 2/1992 | Hosono | 430/5 |

OTHER PUBLICATIONS

M. D. Levenson, "Improving Resolution in Photolithograph with a Phase-Shifting Mask", IEEE Translations on Electron Devices, vol. ED-29, No. 12, pp. 1828, 1836 (Dec. 1982).

A. Nitayama, et al., "New Phase Shifting Mask with Self-Aligned Phase Shifters for a Quarter Micron Photolithography", IEDM pp. 57-60 (1989).

T. Terasawa, et al., "0.3-Micron Optical Lithograph Using a Phase-Shifting Mask", SPIE vol. 1088 Optical/Laser Microlithography II pp. 25-33 (1989).

Primary Examiner—Marion E. McCamish
Assistant Examiner—S. Rosasco
Attorney, Agent, or Firm—Graham S. Jones, II; Dale M. Crockatt

[57] ABSTRACT

A phase-shifting mask is composed of material including a substrate carrying a first phase-shifting layer having a phase-shift of $\Theta$, a second phase-shifting layer stacked upon the first layer having a phase-shift of $(2\pi - \Theta)$, and a third phase-shifting layer stacked upon the second layer next with a phase-shift of $\Theta$. Missing phase-shifters, unwanted phase-shifters, or defects in the transparent films are repaired by removing one or two layers depending upon whether the phase-shifting status has to be retained or altered. In one alternative a large etch selectivity exists between the first, second and third layers, or else a lack of etch selectivity is complemented with etch stop layers embedded between the phase-shifting layers as follows: a) if an defect is found in a phase-shifted area and the defect must be removed without turning the phase-shifted area into a non-phase-shifted area, then two successive layers in the phase-shifted area are removed; b) if an error is found in a non-phase-shift area, then the mask can be repaired in the area surrounding the error by removing the layer in the area to make the area a phase-shifted area; c) if a defect is found in a non-phase-shifted area and the defect must be removed without turning the phase-shifted area into a phase-shifted area, then two successive layers in the non-phase-shifted area are removed.

12 Claims, 5 Drawing Sheets

FIG. 1A
(PRIOR ART)
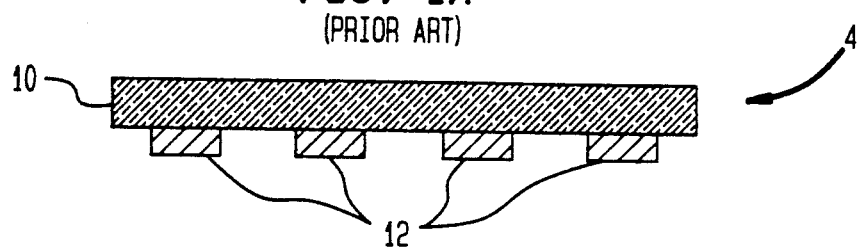
FIG. 1B
(PRIOR ART)
FIG. 1C
(PRIOR ART)
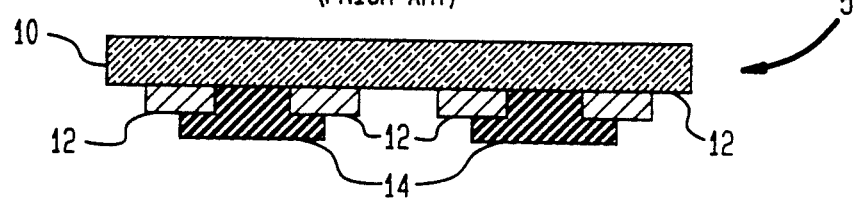
FIG. 1D
(PRIOR ART)
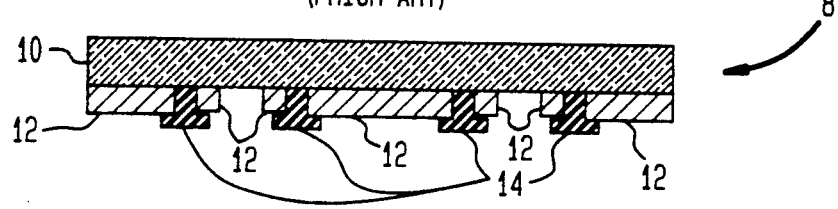
FIG. 1E
(PRIOR ART)
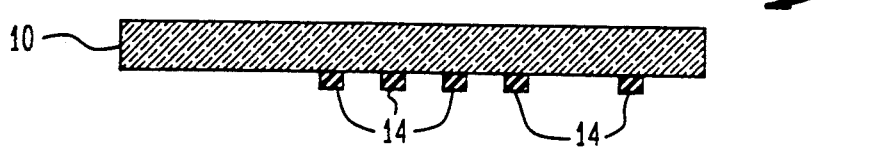
FIG. 1F
(PRIOR ART)
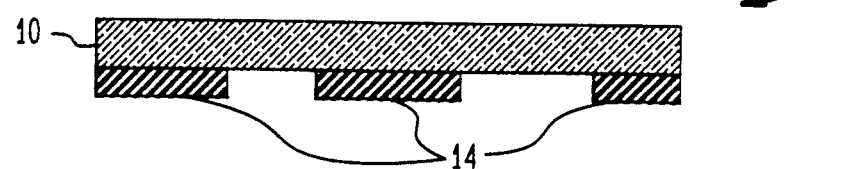

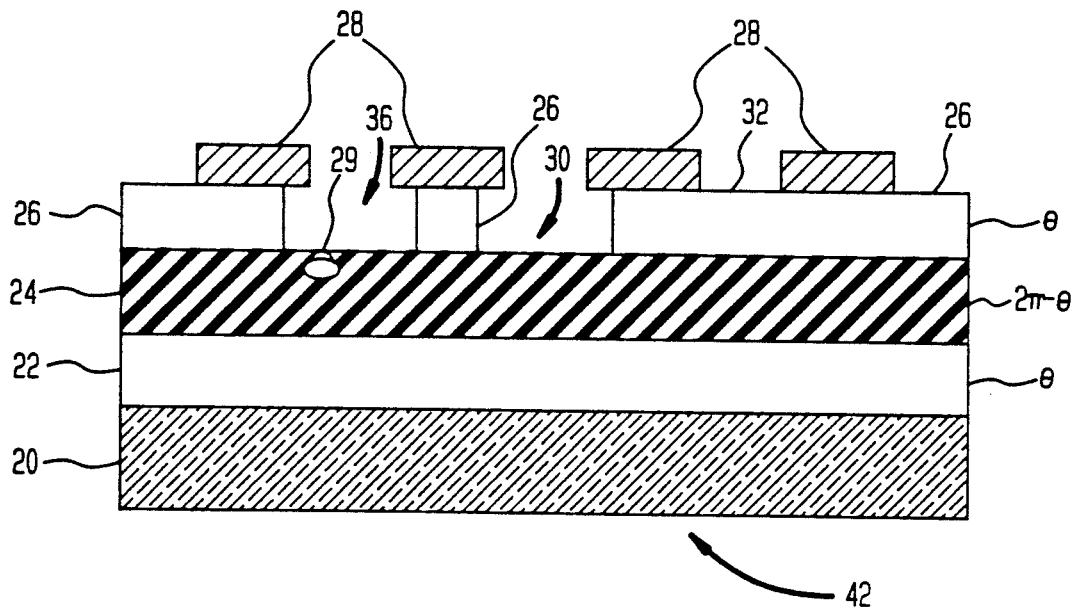
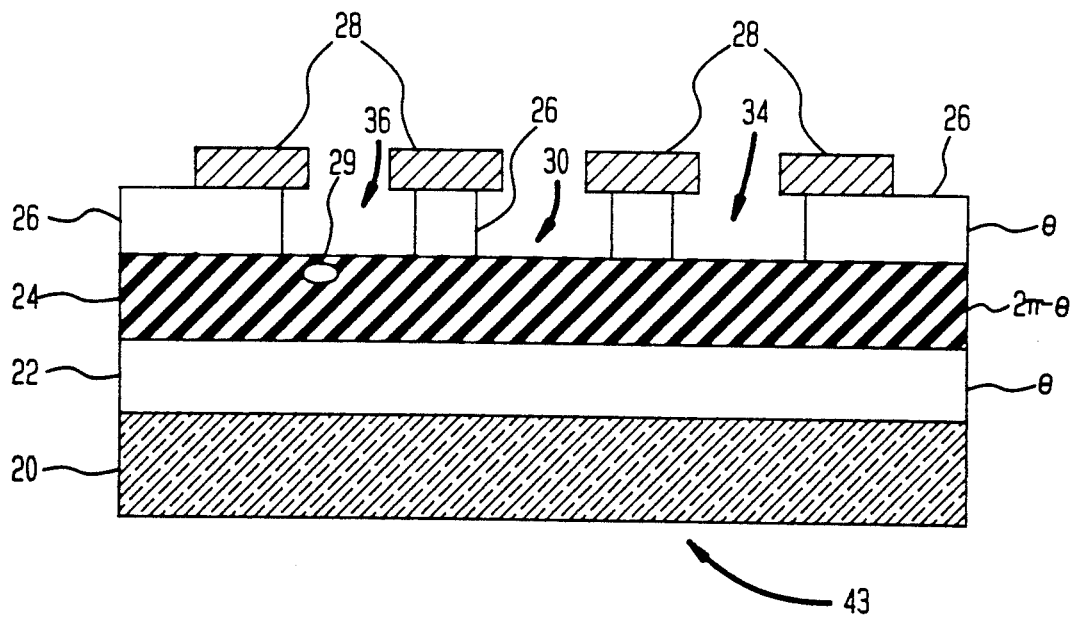

MASK-STRUCTURE AND PROCESS TO REPAIR MISSING OR UNWANTED PHASE-SHIFTING ELEMENTS

BACKGROUND OF THE INVENTION

Field of the Invention

This invention relates to masks for lithography and more particularly to phase-shifting masks for use in photolithography.

Description of Related Art

In photolithography, masks are employed to expose a pattern upon a work piece. As manufacturing requirements call for exposure of patterns with smaller and smaller dimensions, it is becoming necessary to employ techniques which permit enhancement of the current performance of the process of photolithography. One trend has been to use electromagnetic energy with shorter wavelengths in the UV wavelengths, x-rays and the like. Alternatively, it has been an approach to employ phase-shifting techniques in the ranges of wavelengths employed heretofore in photolithography.

The phase-shifting technique can improve the resolution of coherent or partially coherent optical imaging systems. It has been shown that normalized resolution $k_1$ can be reduced from 0.7 to 0.35 to improve lithography by two generations.

Phase shifting systems are well known ways of enhancing the resolution of masks. FIGS. 1A-1F show prior art phase-shifting systems for mask structures. The drawings show the configuration of representative phase-shifting systems, namely, conventional (FIG. 1A) alternating phase-shifting (FIG. 1B), subresolution-assisted phase-shifting (FIG. 1C), edge phase-shifting (FIG. 1D), subresolution unattenuated phase-shifting (FIG. 1E) and unattenuated phase-shifting (FIG. 1F).

All the FIG. 1B-1F prior art phase-shifting systems require a phase-shifting layer 14 whose thickness (t) is equal to as follows:

$$t = \frac{\lambda * \Theta}{2\pi(n_p - n_o)}$$

where
- $\lambda$—is the wavelength,
- $\Theta$—is the phase-shift in radians,
- $n_p$—is the refractive index of the phase-shifting layers,
- $n_o$—is the refractive index of the non-phase-shifting layers.

In FIG. 1A, the conventional mask 4 comprises a substrate 10 composed of, for example, quartz coated with an array of chrome elements 12 which are configured as a conventional mask pattern.

FIG. 1B shows an alternating phase-shifting mask 5 with the substrate 10 carrying an underlayer of spaced chrome markings 12 similar to those in FIG. 1A, plus an overlayer of phase-shifters 14 composed of $SiO_2$, for example.

FIG. 1C shows a subresolution mask 8 with a set of chrome patterns with small openings near the edges of chrome elements 12, into which phase-shifters 14 are deposited and overlap the surface of the mask 12.

FIG. 1D shows an edge phase-shifting mask 7 with the phase-shifter 14 whose edges become darker images.

FIG. 1E shows a subresolution unattended phase-shifter mask 6 with the phase-shifting elements 14 applied directly to the substrate 10 without any conventional (chrome) mask elements.

FIG. 1F shows an unattenuated mask 9 with a substrate 10 having a set of spaced phase-shifters 14 of significant area. Phase shifters 14 are unattenuated.

Despite the potential for resolution improvement, it is difficult to repair a mask in case a phase-shifting pattern is misplaced, missing or added inadvertently in cases such as those shown in FIGS. 1A-1F. Existing techniques can be used to add or subtract from the phase-shifter, but controlling the thickness, refractive index, absorption coefficient, and smoothness of the materials of the mask is formidably difficult.

DIFFICULTIES IN PHASE SHIFT MASK REPAIR

The difficulties in phase-shifting mask repair are as follows:
1) removal or addition of the exact material thickness required where a repair is needed,
2) leaving a smooth finish, and
3) controlling the absorption and the refractive index of the materials affected.

BRIEF DESCRIPTION OF THE DRAWINGS

FIGS. 1A-1F show prior art phase-shifting systems for mask structures.

FIGS. 3A-3F show a series of three layer phase-shifting structures in accordance with the designs shown in FIGS. 2A and 2B.

DESCRIPTION OF THE PREFERRED EMBODIMENT

Figure 2A:
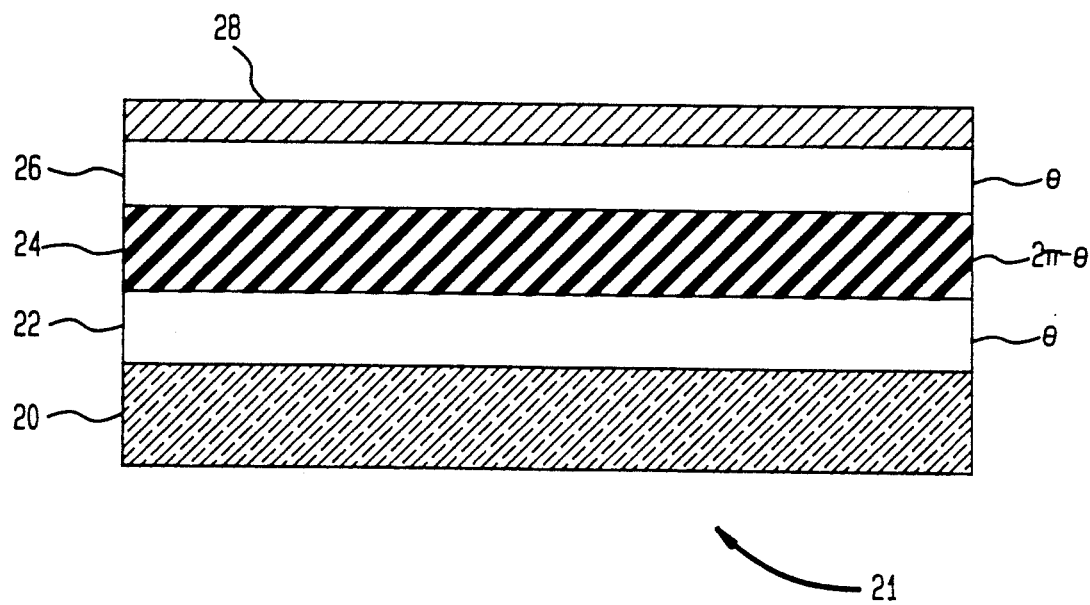
FIG. 2A shows a phase-shifting mask material in accordance with this invention prior to patterning.
Figure 2B:
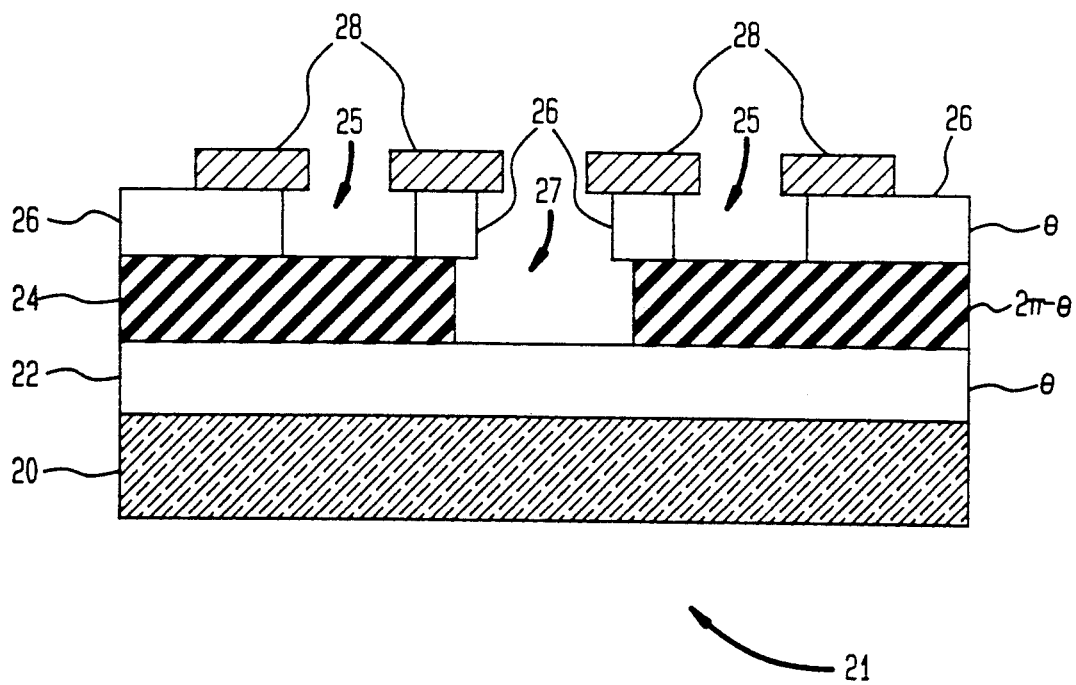
FIG. 2B shows the mask material of FIG. 2A subsequent to patterning and with no defect.

This invention provides a mask structure 21 that is suitable for repair. FIG. 2A shows the material of a phase-shifting mask 21 suitable for use in making masks 21 in accordance with this invention, prior to patterning of the material. FIG. 2B shows the mask material of FIG. 2A formed into a defect free, completed mask 21 subsequent to patterning. In FIGS. 2A and 2B three phase-shifting layers 22, 24, and 26 of mask 21 are stacked, with one beneath the next. Instead of providing one phase-shifting layer on top of the mask substrate 20 (similar to mask 10 in FIGS. 1A-1F), in accordance with this invention the three phase-shifting layers 22, 24 and 26 are stacked, one upon the next with a phase-shift of $\Theta$ for layer 22, $(2\pi - \Theta)$ for layer 24, and $\Theta$ for layer 26. On top of layer 26 is a layer of an absorber 28. To fabricate a mask initially, the top layer 28 which is an absorber (composed of a material such as chromium) is patterned as usual. The top phase-shifting layer 26 is retained in areas where a phase-shift of $\Theta$ is required. Because the total phase-shift of the remaining two layers is $2\pi$ and that of the three layers is $(2\pi + \Theta)$, the desirable phase-shift difference of $\Theta$ is achieved. If a defect were to be found in the shifted area, and a repair has to be made to make it an unshifted area, the top layer 26 can be removed selectively as in areas 25 in FIG. 2B. Similarly, if a spot in the unshifted area has to be made phase-shifting, the middle layer 24, which is now the remaining uppermost layer, can be removed where desired as illustrated in area 27 in FIG. 2B.

If a defect is found in a phase-shifted area and it has to remain phase-shifted after repair, then the mask layers 26 and 24 can be removed in that area. Similarly, if a repair has to be made in an unshifted area, and it has to remain unshifted, such as area 25, then layers 24 and 22 can be removed at area 25.

In addition to repairing initial missing phase-shifters, the remaining mask can be repaired a second time by etching off one or two of the remaining layers. A large etch selectivity between the three layers 22, 24 and 26 is required. Specifically, a sandwich of silicon nitride/silicon dioxide/silicon nitride ($Si_3N_4/SiO_2/Si_3N_4$) meets the requirement, especially with wet etching.

Alternately, $Al_2O_3/SiO_2/Al_2O_3$ also meets the requirement.

In addition a sandwich of alternating layers of $SiO_2$ (phase shift)/etch stop/$SiO_2$(phase shift)/etch stop/-$SiO_2$(phase shift)/etch stop/ also meets the requirement. As indicated, an etch stop layer such as $Al_2O_3$ or $Si_3N_4$, which is very thin, must be inserted between layers 22, 24 and 26.

Figure 3A:
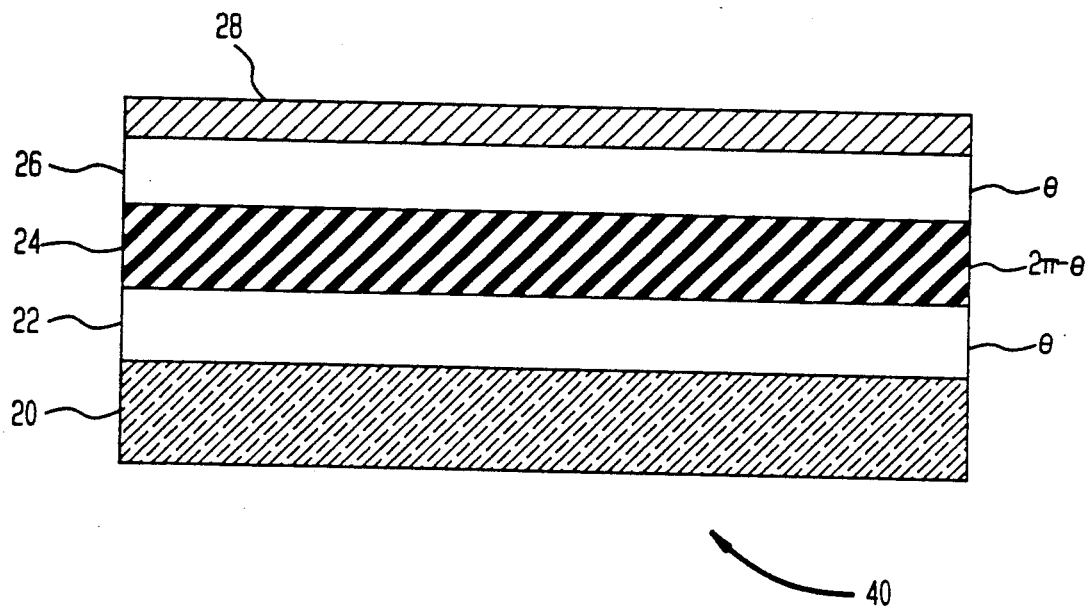
Figure 3B:
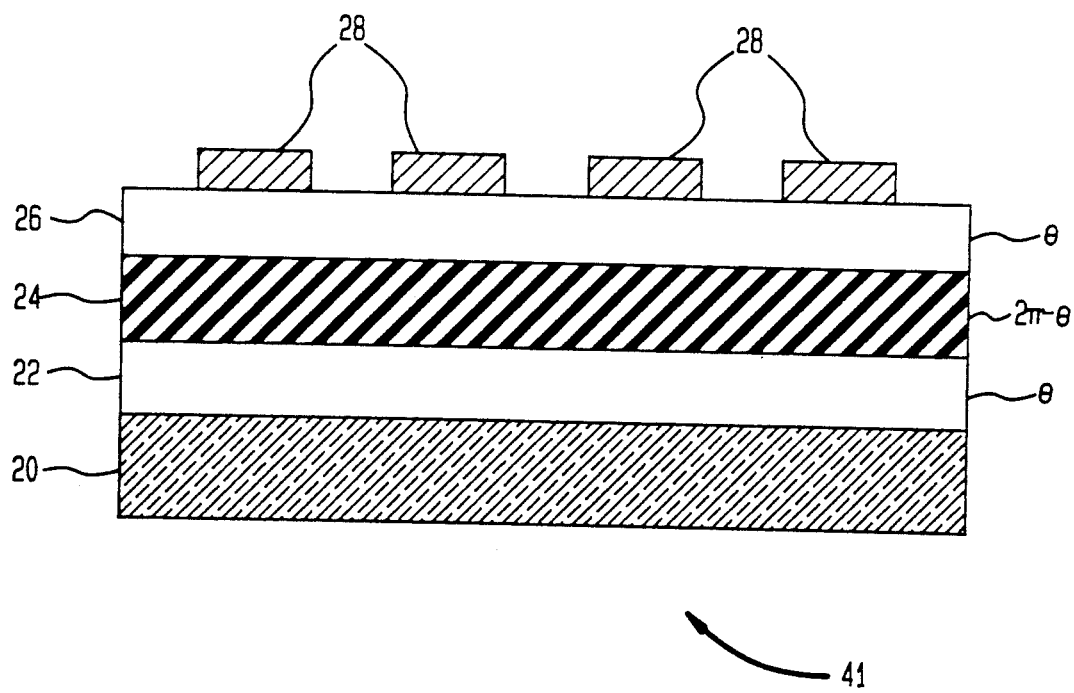

FIGS. 3A-3F show a series of three layer phase-shifting structures in accordance with the designs shown in FIGS. 2A and 2B, where like reference numbers apply to like layers, etc. FIGS. 3A and 3B show the initial stages of forming a mask 40. In FIG. 3A, an "unpatterned" mask 40 is shown with the three phase-shifting layers 22, 24, and 26 coated with a top absorber layer 28, which is patterned by the usual methods to produce the mask 41 with a "patterned absorber" forming a very simple mask 41 with no apparent defects, in FIG. 3B. If there were defects in the absorber, they could be repaired with conventional mask repair techniques.

FIG. 3C shows a phase-shifting mask in which the defects are found as follows:
1) blemish 29 is shown in layer 24 in area 36;
2) Area 30 should be phase-shifting, but is not;
3) Area 32 should not be phase-shifting, but is.

Area 32 is repaired by putting a new resist coating on the mark, selectively removing it and etching out layer 26 as in FIG. 3D.

Then, with a new resist coating and the selective removal at areas 30 and 36 in FIG. 3D, layer 24 is selectively etched at areas 30 and 36 to repair area 30 as in FIG. 3D. A third resist coating and selective removal step at area 36 in FIG. 3E permits etching of layer 22 to complete the repair as in FIG. 3F.

Figure 3E:
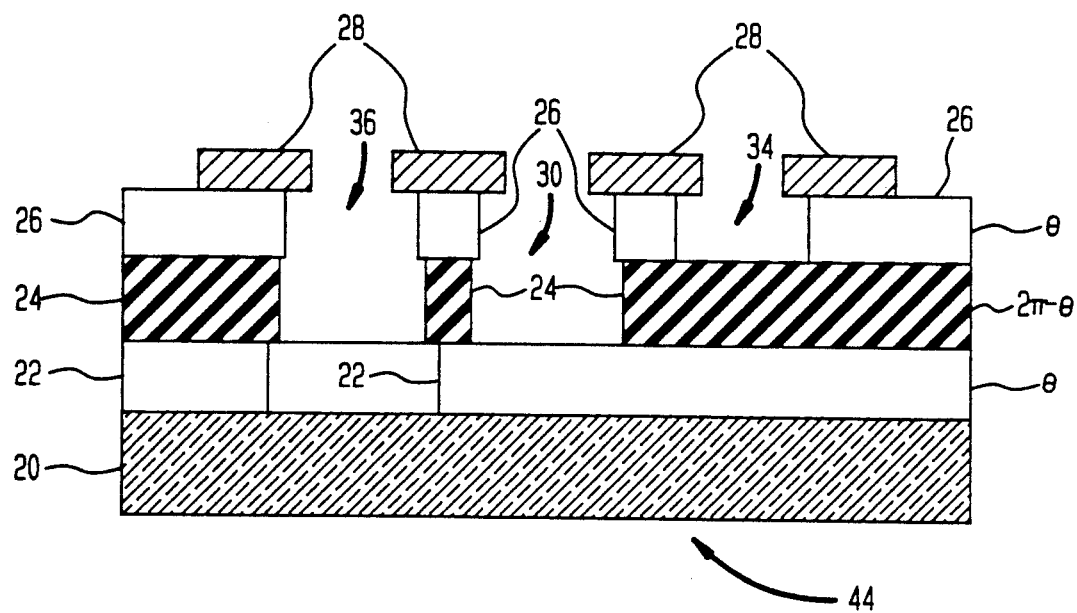
Figure 3F:
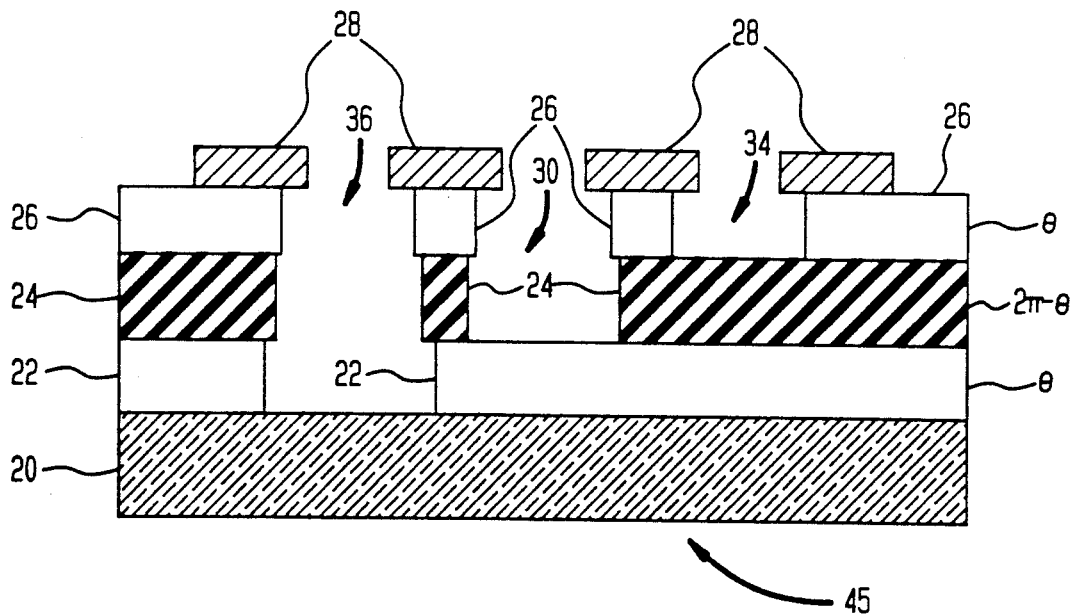

FIGS. 3D-3F show how to repair defects or remove unwanted phase-shifting areas in masks 43-45 in accordance with this invention. The mask to be repaired is coated with resist in the usual way well known to those skilled in the art and the area to be repaired is exposed or left unexposed with a positive or negative repair resist layer respectively. After development of the repair resist layer, the uncovered areas of the three layer phase-shifting mask layers are etched away to convert a phase-shifted area into a non-phase-shifting area. For example, from area 32 in FIG. 3C opening 34 in FIG. 3D is made. Then with a new resist coating and selective removal at areas 30 and 36 in FIG. 3D, layer 24 is selectively etched at areas 30 and 36 to repair area 30 as in FIG. 3E. A third resist coating and selective removal step at area 36 in FIG. 3E permits etching of layer 22 to complete the repair as in FIG. 3F. The resist in a non-phase-shifted area can be uncovered in the same repair exposure level to facilitate the removal of the two phase-shifting openings 30 and 36 in FIG. 3D to produce the one phase-shift openings 30 and 36 in FIG. 3E or the one phase-shift opening 30 in FIG. 3F. The mutually exclusive etchants (e.g. $CF_4$) for the three phase-shift areas and the two phase-shift layers facilitate the uncovering of both types of error in the same exposure. Otherwise, two separate exposures for each type of error can be used.

In detail, in FIG. 3C, mask 42 is shown with a defect 29 in the intermediate phase-shifting layer 24 which has a phase-shift value of $2\pi-\Theta$. The objective is to remove the defect as shown by masks 44 and 45 in FIGS. 3E and 3F, respectively, which show masks which have been processed further to remove the defect 29. In addition, a portion of phase-shifter is missing in opening 30, where it was not supposed to be missing, and that is a problem which is solved as shown by the mask 44 in FIG. 3E. A third problem in FIG. 3C is that the phase-shifter layer 26 in area 32 is unwanted and should have been removed when the material in opening 36 was removed. That problem needs to be dealt with as it has been in FIG. 3D where mask 43 has an opening 34, where unwanted material 32 has been removed.

In FIG. 3D, the mask 43 simply shows the result of removing the material 32, and the other problems are dealt with in FIGS. 3E and 3F as indicated above.

In FIG. 3E, the lack of phase-shifting in opening 30 has been repaired by removal of layer 22 in that area, as well as taking out layer 22 to remove the material housing the defect 29 in FIG. 3C and 3D, but not solving the problem that the phase-shift is now incorrect. That latter problem is solved in FIG. 3F.

In FIG. 3F, the layer 22 is removed in the opening 36 below where defect 29 wall located so that the phase-shift will now be as was originally intended by removal of all three of the phase-shifting layers.

For convenience, the phase-shifting area is always associated with the area with more high refractive index material, e.g. "1" was identified as the phase-shifted area and "2" the no phase-shifting area in FIG. 2, because phase-shifting is relative. These designations can be exchanged throughout without affecting the spirit of this invention.

A defect can be repaired by elimination of the resist holding the defect as shown FIG. 3F.

What is claimed is:

1. A phase-shifting mask material comprising
   a) a phase-shifting mask substrate material,
   b) a first phase-shifting layer formed upon said substrate material, with a phase-shift of $\Theta$ for said first layer,
   c) a second phase-shifting layer formed upon said first layer with a phase-shift of $(2\pi-\Theta)$ for said second layer, and
   d) a third phase-shifting layer formed upon said second layer next with a phase-shift of $\Theta$ for said third layer, wherein missing phase-shifters, unwanted phase-shifters, or defects in the transparent films are repaired by removing one or two layers above said subtrate material depending upon whether the phase-shifting status has to be retained or altered.

2. A phase-shifting mask material in accordance with claim 1 wherein a substantial etch selectivity between said first, second and third layers exists.

3. A phase-shifting mask material in accordance with claim 1 wherein lack of etch selectivity is complemented with etch stop layers embedded between said phase-shifting layers.

4. A phase-shifting mask material in accordance with claim 3 wherein if an error is found in a non-phase-shifting area, then the mask can be repaired in the area surrounding said error by removing the layer in said area to make said area a phase-shifted area.

5. A phase-shifting mask material in accordance with claim 3 wherein if a defect is found in a phase-shifted area and said defect must be removed without turning the phase-shifted area into a non-phase-shifted area, then two successive layers in said phase-shifted area are removed.

6. A phase-shifting mask material in accordance with claim 3 wherein if a defect is found in a non-phase-shifted area and said defect must be removed without turning the phase-shifted area into a phase-shifted area, then two successive layers in said non-phase-shifted area are removed.

7. A phase-shifting mask comprising
 a) a phase-shifting mask substrate material, and formed upon said substrate material first, second and third phase-shifting layers stacked, one upon the next with a phase-shift of $\Theta$ for said first layer, $(2\pi - \Theta)$ for said second layer, and $\Theta$ for said third layer,
 b) said third layer being etched off in areas which require no phase-shifting, and
 c) said third layer being retained in areas where a phase-shift of $\Theta$ is required,
whereby if a defect is found in a phase-shifted area, then said mask can be repaired by removing said third layer to make it a zero phase-shift area by removing said third layer, and if a mistake is made in the repair then the second layer can be etched away to correct it.

8. A phase-shifting mask in accordance with claim 7 wherein a substantial etch selectivity between the three layers exists.

9. A phase-shifting mask material comprising
 a) a quartz substrate,
 b) a first phase-shifting layer formed upon said substrate, with a phase-shift of $\Theta$ for said first layer,
 c) a second phase-shifting layer formed upon said first layer with a phase-shift of $(2\pi - \Theta)$ for said second layer, and
 d) a third phase-shifting layer formed upon said second layer next with a phase-shift of $\Theta$ for said third layer,
wherein missing phase-shifters, unwanted phase-shifters, or defects in the transparent films are repaired by removing one or two layers above said subtrate depending upon whether the phase-shifting status has to be retained or altered.

10. A phase-shifting mask comprising
 a) a quartz substrate, and first, second and third phase-shifting layers formed upon said substrate, said first, second and third phase-shifting layers being stacked, one upon the next with a phase-shift of $\Theta$ for said first layer, $(2\pi - \Theta)$ for said second layer, and $\Theta$ for said third layer,
 b) said third layer being etched off in areas which require no phase-shifting, and
 c) said third layer being retained in areas where a phase-shift of $\Theta$ is required,
whereby if a defect is found in a phase-shifted area, then said mask can be repaired by removing said third layer to make it a zero phase-shift area by removing said third layer, and if a mistake is made in the repair then the next layer can be etched away to correct it.

11. A phase-shifting mask in accordance with claim 10 wherein a large etch selectivity between said three layers exists.

12. A phase-shifting mask comprising
 a) a phase-shifting mask substrate material, and formed upon said substrate material first, second and third phase-shifting layers stacked, one upon the next with a phase-shift of $\Theta$ for said first layer, $(2\pi - \Theta)$ for said second layer, and $\Theta$ for said third layer,
 b) said third layer being etched off in areas which require no phase-shifting, and
 c) said third layer being retained in areas where a phase-shift of $\Theta$ is required,
whereby if a defect is found in a phase-shifted area, then said mask can be repaired by removing said third layer to make it a zero phase-shift area by removing said third layer, and if a defect requires then the second layer can be etched away to correct it, and the first layer can be removed as well if required to remove and correct for the defect.

* * * * *